(12) United States Patent
Jiang et al.

(10) Patent No.: US 11,871,512 B2
(45) Date of Patent: Jan. 9, 2024

(54) CIRCUIT BOARD

(71) Applicant: ASUSTeK COMPUTER INC., Taipei (TW)

(72) Inventors: Zhen-De Jiang, Taipei (TW); Pin-Tang Chiu, Taipei (TW); Chia-Ho Lin, Taipei (TW); Zhi-Hua Feng, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 287 days.

(21) Appl. No.: 17/489,927

(22) Filed: Sep. 30, 2021

(65) Prior Publication Data

US 2022/0117081 A1 Apr. 14, 2022

(30) Foreign Application Priority Data

Oct. 8, 2020 (TW) .................................. 109135055

(51) Int. Cl.
| | |
|---|---|
| *H05K 1/02* | (2006.01) |
| *H05K 1/16* | (2006.01) |
| *H01Q 1/48* | (2006.01) |
| H05B 45/30 | (2020.01) |
| H01Q 23/00 | (2006.01) |

(52) U.S. Cl.
CPC ............. *H05K 1/0274* (2013.01); *H01Q 1/48* (2013.01); *H05K 1/0243* (2013.01); *H05K 1/16* (2013.01); *H01Q 23/00* (2013.01); *H05B 45/30* (2020.01); *H05K 2201/10098* (2013.01); *H05K 2201/10106* (2013.01)

(58) Field of Classification Search
CPC ....................... H05K 1/0274; H05K 1/16–167
See application file for complete search history.

(56) References Cited

U.S. PATENT DOCUMENTS

| 10,405,220 B2 | 9/2019 | Yu et al. |
|---|---|---|
| 2014/0218247 A1 | 8/2014 | Tefiku |

FOREIGN PATENT DOCUMENTS

| CN | 103972646 A | 8/2014 |
|---|---|---|
| CN | 106090638 A | 11/2016 |
| CN | 207252013 U | 4/2018 |
| CN | 208190699 U | 12/2018 |
| CN | 110459859 A | 11/2019 |
| CN | 107509305 B | 3/2020 |
| CN | 210723345 U | 6/2020 |
| TW | 201228110 A1 | 7/2012 |
| TW | 201507282 A | 2/2015 |

*Primary Examiner* — Jeremy C Norris
(74) *Attorney, Agent, or Firm* — McClure, Qualey & Rodack, LLP

(57) ABSTRACT

A circuit board includes a substrate, a driver circuit, at least one light-emitting element, a grounding circuit, and an antenna unit. The substrate includes a first circuit layer and a second circuit layer. The driver circuit is located on the first circuit layer. The light-emitting element is located on the first circuit layer and is electrically connected to the driver circuit, so that the driver circuit controls the light-emitting element to emit light. The grounding circuit is located on the second circuit layer and is electrically connected to the driver circuit. The grounding circuit includes a plurality of conductive traces, and the conductive traces are arranged toward one side to form a clearance area on the second circuit layer. The antenna unit is located on the first circuit layer and corresponds to the clearance area to receive and transmit a radio frequency signal.

11 Claims, 11 Drawing Sheets

CIRCUIT BOARD

CROSS-REFERENCE TO RELATED APPLICATION

This application claims the priority benefit of Taiwan Application Serial No. 109135055, filed on Oct. 8, 2020. The entirety of the above-mentioned patent application is hereby incorporated by reference herein and made a part of the specification.

BACKGROUND OF THE INVENTION

Field of the Invention

The disclosure relates to an antenna and a circuit board of a light-emitting element.

Description of the Related Art

An upper surface layer of a common LED circuit board includes an LED light unit, electronic elements, and a radio frequency circuit, and a lower surface layer includes a radio frequency grounding circuit. Currently, an entire space of the LED circuit board is fully occupied by various electronic elements and circuits, and no further spaces on the circuit board can be utilized to provide functions more than lightening.

BRIEF SUMMARY OF THE INVENTION

According to an aspect of the disclosure, a circuit board is provided. The circuit board includes a substrate, a driver circuit, at least one light-emitting element, a grounding circuit, and an antenna unit. The substrate includes a first circuit layer and a second circuit layer opposite to each other. The driver circuit is located on the first circuit layer. The light-emitting element is located on the first circuit layer and is electrically connected to the driver circuit, so that the driver circuit controls the light-emitting element to emit light. The grounding circuit is located on the second circuit layer and is electrically connected to the driver circuit. The grounding circuit includes a plurality of conductive traces, and the conductive traces are arranged toward one side in central to form a clearance area on the second circuit layer. The antenna unit is located on the first circuit layer and corresponds to the clearance area to receive and transmit a radio frequency signal.

Therefore, in the disclosure, a position for arranging the conductive traces of the grounding circuit on the second circuit layer of the substrate is adjusted to provide a space for an antenna unit at the first circuit layer of the substrate, to integrate the antenna unit by effectively utilizing a limited space and improve existing functions of the circuit board.

DETAILED DESCRIPTION OF THE EMBODIMENTS

Figure 1:
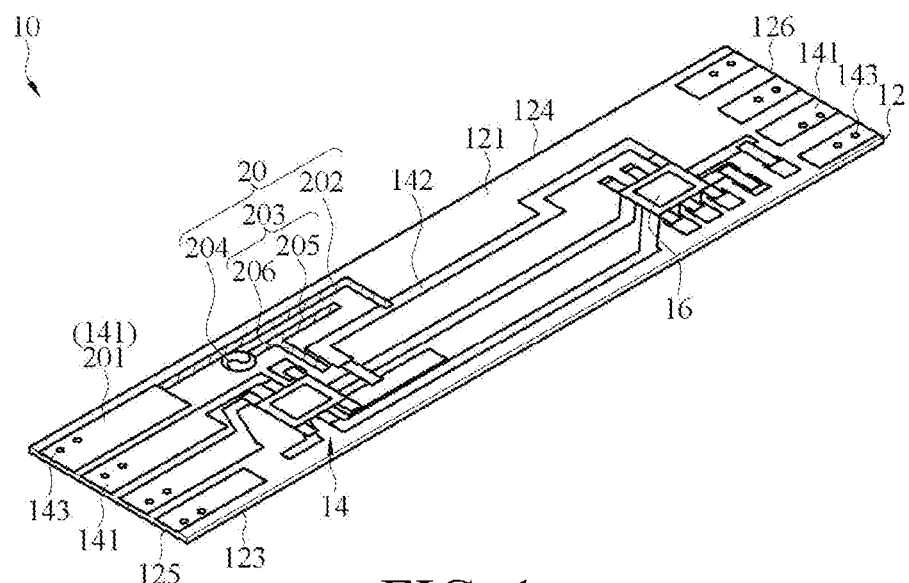
FIG. 1 is a schematic three-dimensional diagram of a circuit board according to an embodiment of the disclosure.
Figure 2:
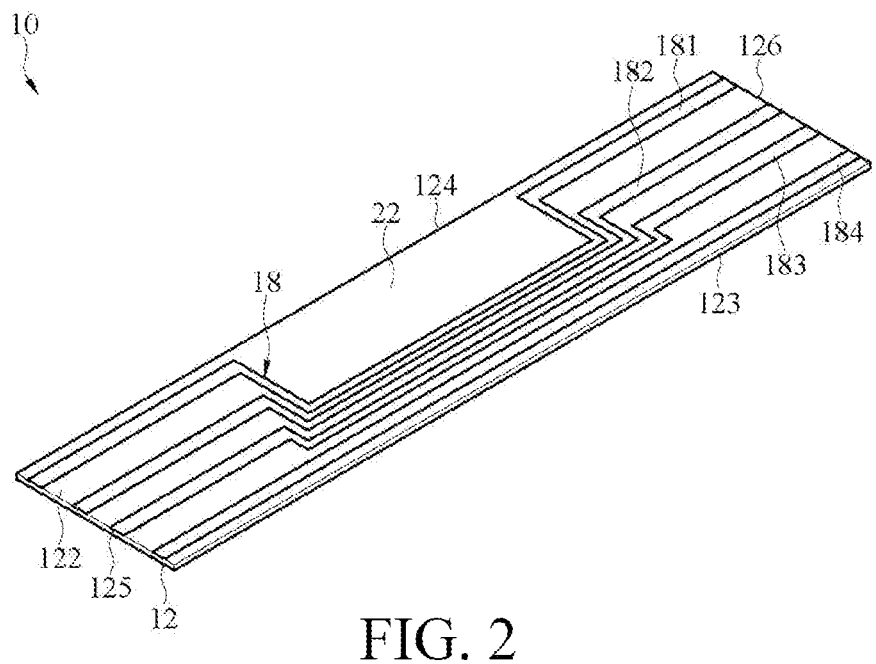
FIG. 2 is a schematic diagram of a bottom of a circuit board according to an embodiment of the disclosure.
Figure 3:
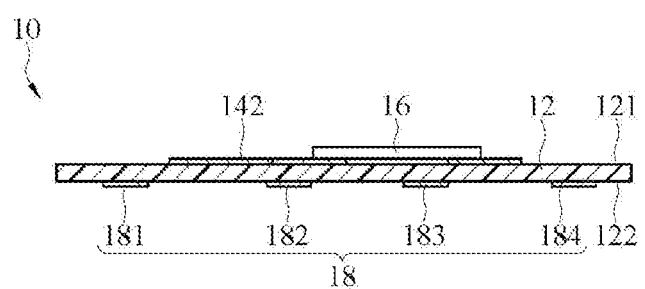
FIG. 3 is a longitudinal cross-sectional view of the circuit board according to FIG. 1.
Figure 4:
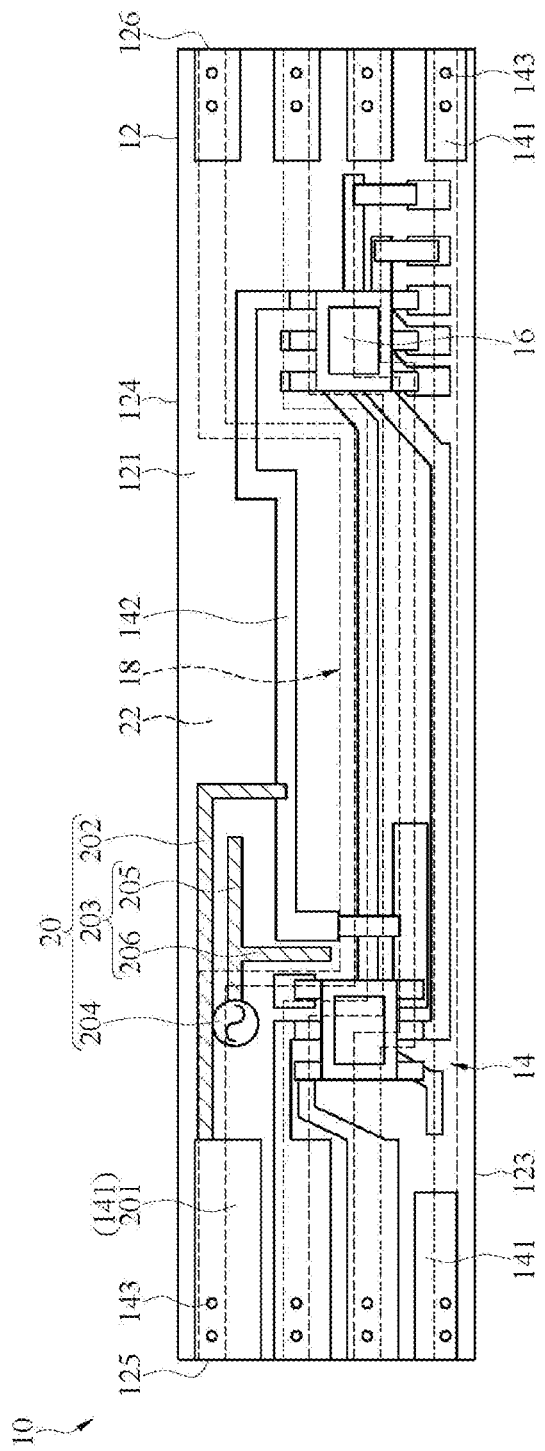
FIG. 4 is a schematic plan view of a circuit board according to an embodiment of the disclosure.

Referring to all of FIG. 1, FIG. 2, FIG. 3, and FIG. 4, a circuit board 10 includes a substrate 12, a driver circuit 14, at least one light-emitting element 16, a grounding circuit 18, and an antenna unit 20. The substrate 12 includes a first circuit layer 121 and a second circuit layer 122 opposite to each other. The first circuit layer 121 is located on an upper surface of the substrate 12. The second circuit layer 122 is located on a lower surface of the substrate 12. The substrate 12 includes a first side edge 123 and a second side edge 124 opposite to each other, and includes a third side edge 125 and a fourth side edge 126 opposite to each other. The third side edge 125 is connected to same ends of the first side edge 123 and the second side edge 124, and the fourth side edge 126 is connected to other ends of the first side edge 123 and the second side edge 124. In an embodiment, the substrate 12 is a flexible printed circuit board (FPCB).

In the circuit board 10, the driver circuit 14 is located on the first circuit layer 121 of the substrate 12, and the light-emitting element 16 is also located on the first circuit layer 121 and is electrically connected to the driver circuit 14, so that the driver circuit 14 controls the light-emitting element 16 to emit light. The grounding circuit 18 is located on the second circuit layer 122 of the substrate 12 and is electrically connected to the driver circuit 14. The grounding circuit 18 includes a plurality of conductive traces 181, 182, 183, 184, and the conductive traces 181, 182, 183, 184 are arranged toward the first side edge 123 of the substrate 12 to form a clearance area 22 on the second circuit layer 122. In an embodiment, the conductive trace 181 is a first conductive trace, the conductive trace 182 is a second conductive trace, the conductive trace 183 is a third conductive trace, and the conductive trace 184 is a power-grounding conductive trace. The conductive traces 181, 182, 183 are bent and extend toward the first side edge 123 to form the clearance area 22 on the second circuit layer 122. The antenna unit 20 is located on the first circuit layer 121 of the substrate 12 close to the second side edge 124, and corresponds to the clearance area 22. Most of a vertical projection of the antenna unit 20 on the second circuit layer 122 is located in the clearance area 22 to transmit, so that a radio frequency signal is received and transmitted through the antenna unit 20.

In an embodiment, the light-emitting element 16 is a light emitting diode (LED), including a red LED, a green LED, a blue LED, and the like, or is a white LED, or is any combination of the foregoing LEDs.

Referring to all of FIG. 1 to FIG. 4, the driver circuit 14 includes a plurality of conductive pads 141 and a metal line segment 142 closest to the antenna unit 20. In embodiments, more conductive traces and electronic elements that configured on the driver circuit 14 may be determined according to practical requirements, the description of which is omitted herein. The plurality of conductive pads 141 is located on the first circuit layer 121 close to the third side edge 125 and the fourth side edge 126, respectively (that is, as showed in FIG. 4, four of the conductive pads 141 locate close to the third side edge 125 and four of the conductive pads 141 locate close to the fourth side edge 126). Four of the conductive pads 141 are electrically connected to four of the conductive traces 181, 182, 183, 184 of the grounding circuit 18 through via holes 143, respectively. In an embodiment, one of the conductive pads 141 that closest to the antenna unit 20 serves as a first grounding connection portion 201 of the antenna unit 20. In addition to the first grounding connection portion 201, the antenna unit 20 further includes a first antenna branch 202, a second antenna branch 203, and a signal source 204. The first antenna branch 202 is connected to the first grounding connection portion 201, extends along the second side edge 124 toward a direction of the fourth side edge 126 and is bent and connected to the metal line segment 142. The second antenna branch 203 is disposed spaced apart from the first antenna branch 202, and is located on the first circuit layer 121 between the first antenna branch 202 and the driver circuit 14. The second antenna branch 203 is a T-shaped antenna branch including a horizontal line segment 205 and a vertical line segment 206. The horizontal line segment 205 extends along the first antenna branch 202, and a gap exists between the horizontal line segment 205 and the first antenna branch 202. The vertical line segment 206 is vertically connected to the horizontal line segment 205 and extends toward a direction away from the first antenna branch 202. The signal source 204 is electrically connected to the second antenna branch 203, and the second antenna branch 203 is coupled to the first antenna branch 202 to generate a required antenna resonance frequency to transmit and receive a radio frequency signal.

Figure 5:
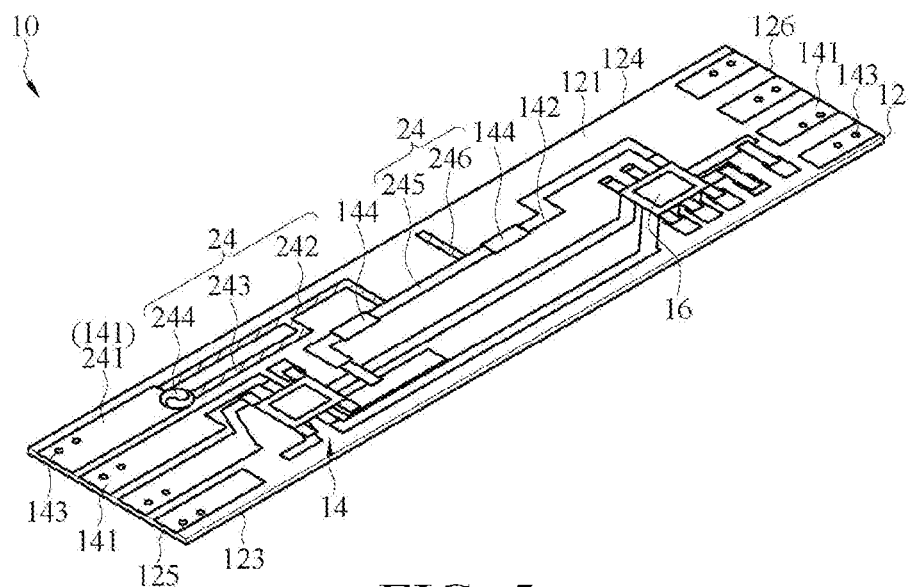
FIG. 5 is a schematic three-dimensional diagram of a circuit board according to another embodiment of the disclosure.
Figure 6:
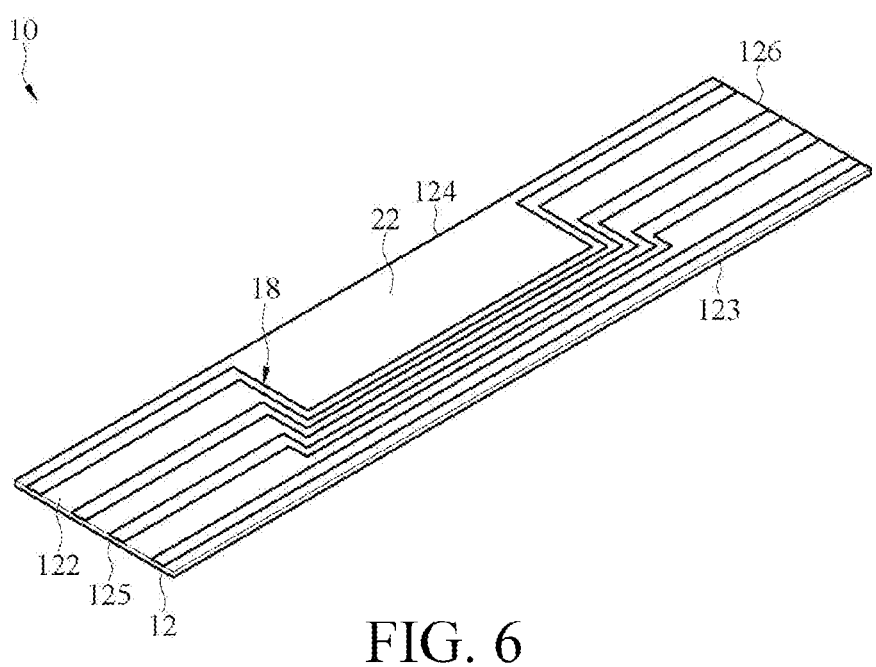
FIG. 6 is a schematic diagram of a bottom of a circuit board according to another embodiment of the disclosure.
Figure 7:
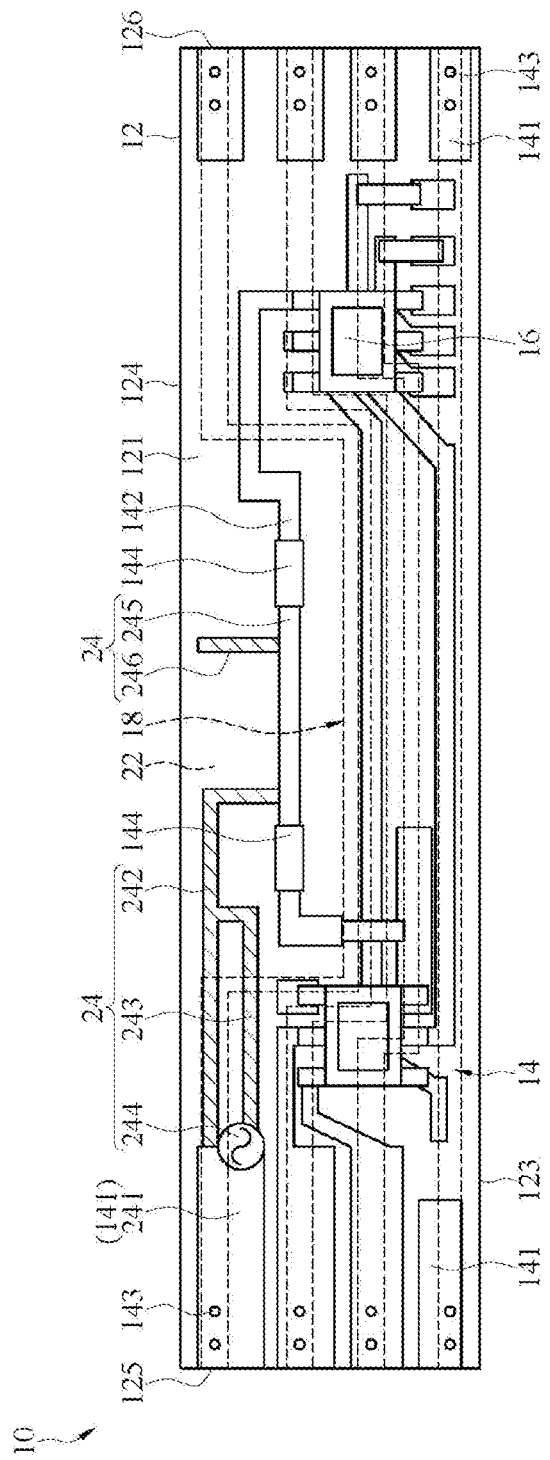
FIG. 7 is a schematic plan view of a circuit board according to another embodiment of the disclosure.

Referring to all of FIG. 5, FIG. 6, and FIG. 7, in an embodiment, a circuit board 10 includes a substrate 12, a driver circuit 14, a light-emitting element 16, a grounding circuit 18, and an antenna unit 24. The driver circuit 14, the light-emitting element 16, and the antenna unit 24 are located on a first circuit layer 121 of the substrate 12, and most of a vertical projection of the antenna unit 24 on a second circuit layer 122 is located in a clearance area 22. In this embodiment, one of the conductive pads 141 closest to the antenna unit 20 serves as a first grounding connection portion 241 of the antenna unit 24. In addition to the first grounding connection portion 241, the antenna unit 24 further includes a first antenna branch 242, a second antenna branch 243, and a signal source 244. Two electronic elements 144, such as passive elements, are further disposed on a metal line segment 142. The electronic elements 144 are utilized to make a part of the metal line segment 142 located between the electronic elements 144 form an open circuit to serve as an antenna extension branch 245. In an embodiment, the electronic element 144 is an inductor or a capacitor. One end of the first antenna branch 242 is connected to the first grounding connection portion 241. The other end of the first antenna branch 242 extends along a second side edge 124 toward a direction of a fourth side edge 126 and is bent and connected to one end of the antenna extension branch 245, and an antenna extension section 246 is vertically connected to the other end of the antenna extension branch 245 and continues to extend toward a direction of the second side edge 124, to ensure a sufficient antenna length. The second antenna branch 243 is located on the first circuit layer 121 between the first antenna branch 242 and the driver circuit 14. One end of second antenna branch 243 is connected to the first antenna branch 242, and the other end of second antenna branch 243 is connected to the signal source 244. The signal source 244 is electrically connected to the second antenna branch 243 and the first grounding connection portion 241. A positive end of the signal source 244 is connected to the second antenna branch 243, and a negative end of the signal source 244 is connected to the first grounding connection portion 241. When a radio frequency signal is fed into the antenna unit 24 from the signal source 244, the signal source 244 is excited by the first antenna branch 242, the antenna extension branch 245, the antenna extension section 246, and the second antenna branch 243 to generate a required antenna resonance frequency to transmit and receive the radio frequency signal.

Figure 8:
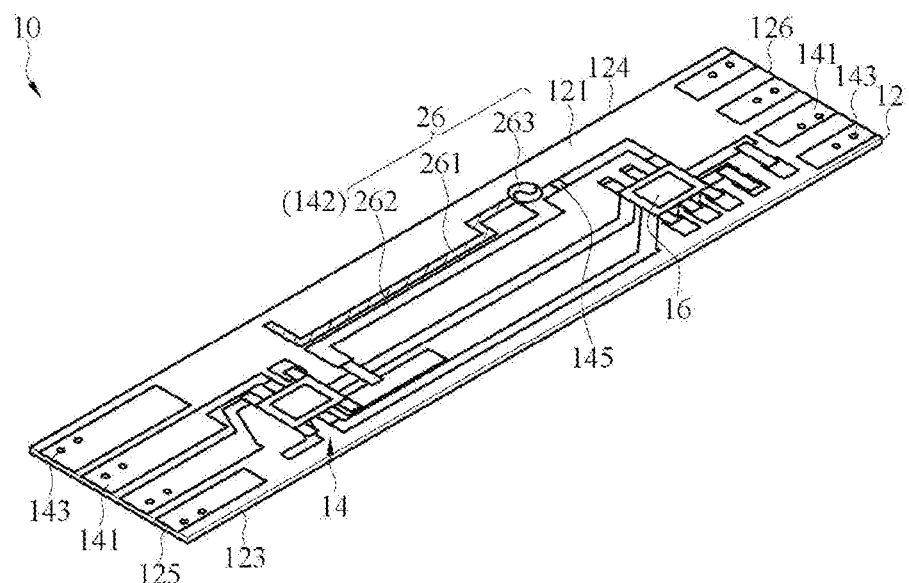
FIG. 8 is a schematic three-dimensional diagram of a circuit board according to still another embodiment of the disclosure.
Figure 9:
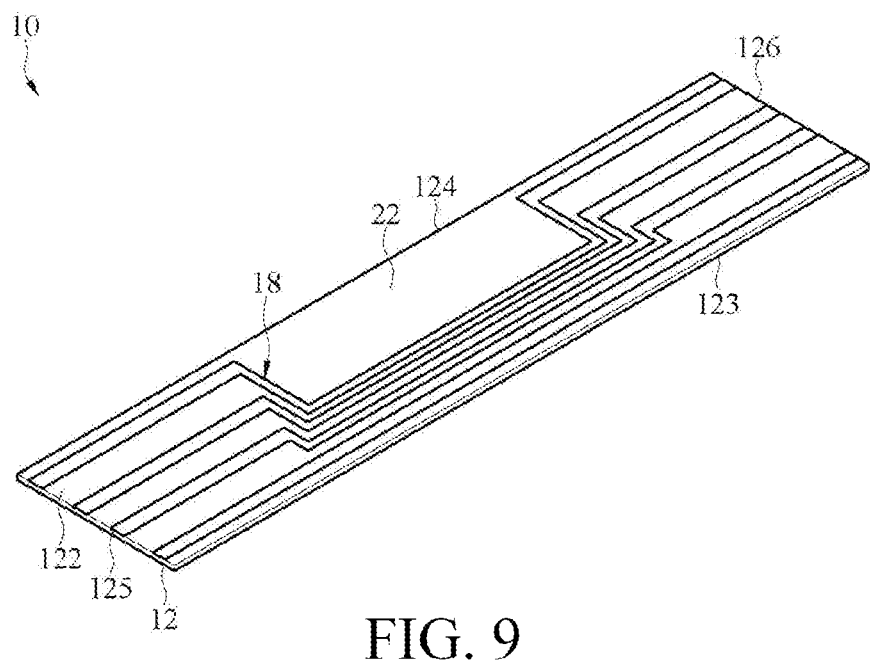
FIG. 9 is a schematic diagram of a bottom of a circuit board according to still another embodiment of the disclosure.
Figure 10:
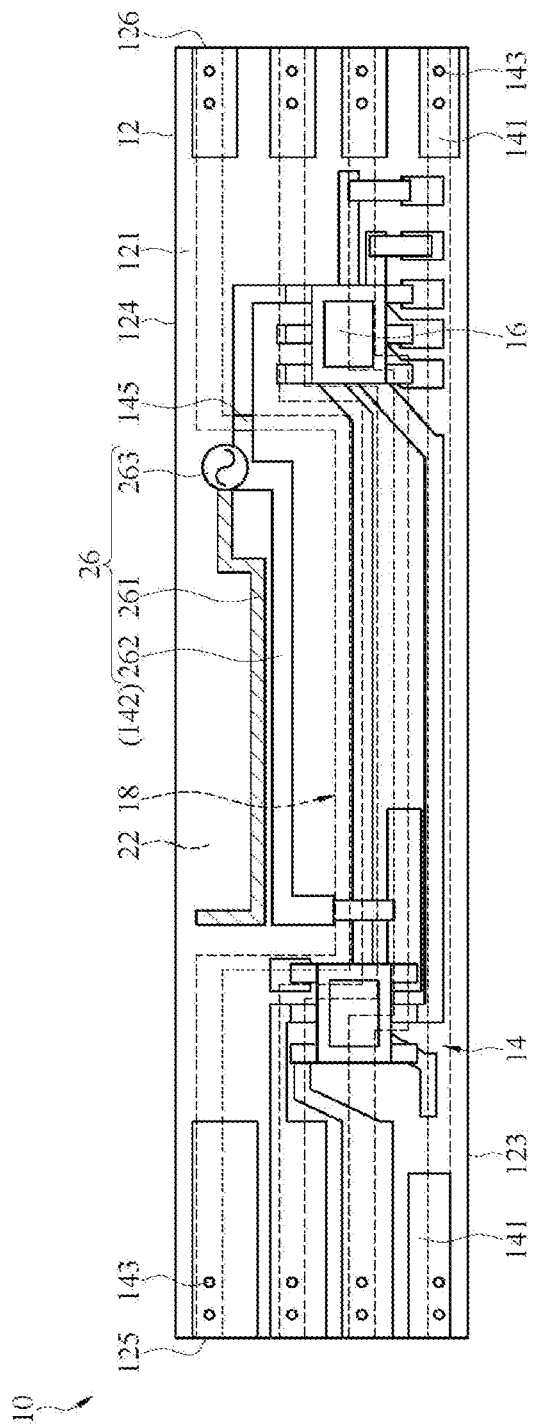
FIG. 10 is a schematic plan view of a circuit board according to still another embodiment of the disclosure.

Referring to all of FIG. 8, FIG. 9, and FIG. 10, in an embodiment, a circuit board 10 includes a substrate 12, a driver circuit 14, a light-emitting element 16, a grounding circuit 18, and an antenna unit 26. The driver circuit 14, the light-emitting element 16, and the antenna unit 26 are located on a first circuit layer 121 of the substrate 12, and a vertical projection of the antenna unit 26 on a second circuit layer 122 is located in a clearance area 22. In this embodiment, the antenna unit 26 includes a first antenna branch 261, a second antenna branch 262, and a signal source 263. A vertical projection of the first antenna branch 261 on the second circuit layer 122 is located in the clearance area 22, and a gap exists between the first antenna branch 261 and a metal line segment 142. The metal line segment 142 forms an open circuit to serve as a second antenna branch 262, that is, one end of the metal line segment 142 close to a fourth side edge 126 is provided with a via hole 145, to electrically connect to a grounding circuit 18 through the via hole 145 for grounding, so that the metal line segment 142 serves as the second antenna branch 262. The signal source 263 is electrically connected to the first antenna branch 261, and the second antenna branch 262 is coupled to the first antenna branch 261, to generate a required antenna resonance frequency to transmit and receive a radio frequency signal.

Figure 11:
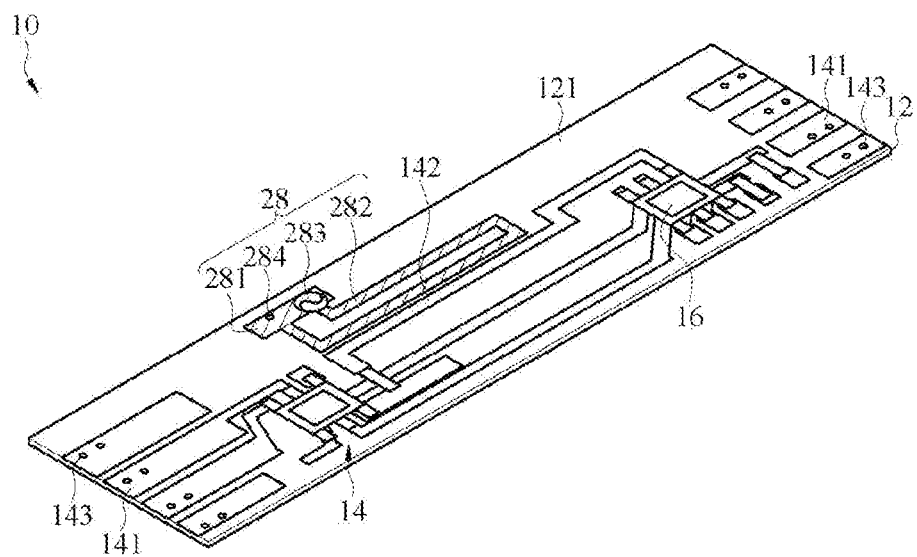
FIG. 11 is a schematic three-dimensional diagram of a circuit board according to yet another embodiment of the disclosure.
Figure 12:
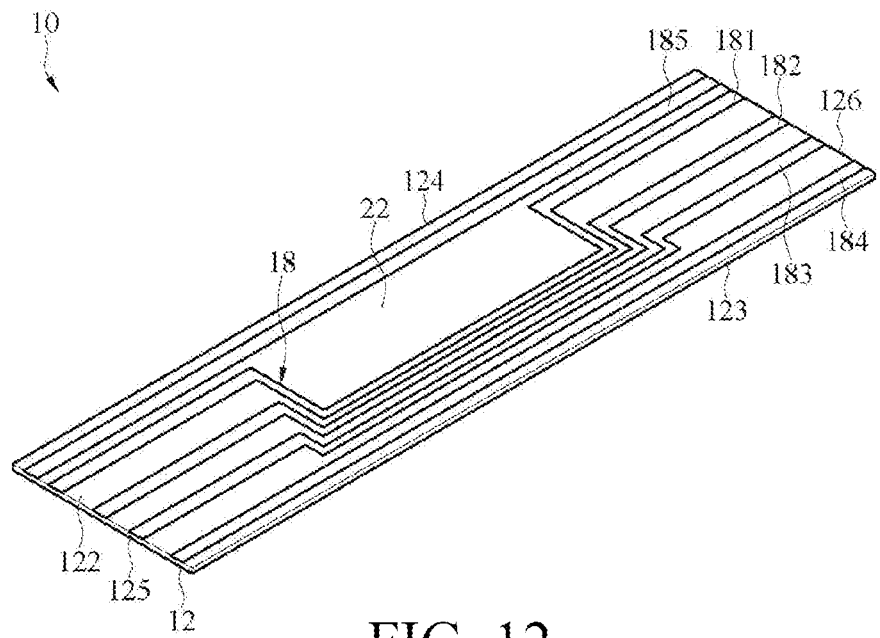
FIG. 12 is a schematic diagram of a bottom of a circuit board according to yet another embodiment of the disclosure.
Figure 13:
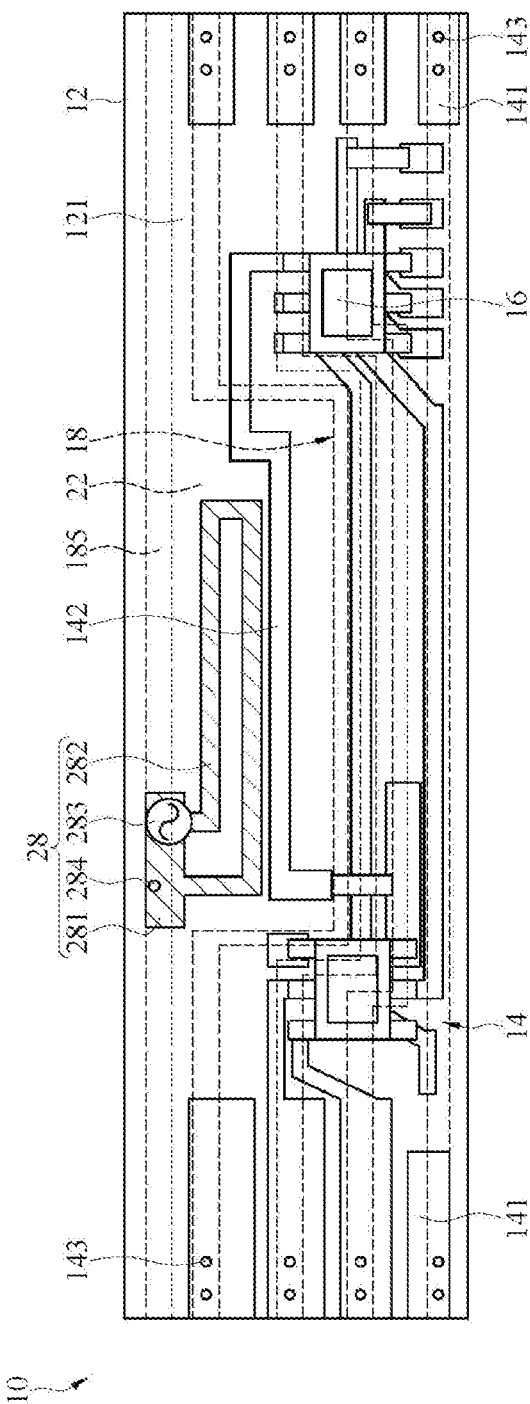
FIG. 13 is a schematic plan view of a circuit board according to yet another embodiment of the disclosure.

Referring to all of FIG. 11, FIG. 12, and FIG. 13, in an embodiment, a circuit board 10 includes a substrate 12, a driver circuit 14, a light-emitting element 16, a grounding circuit 18, and an antenna unit 28. The driver circuit 14, the light-emitting element 16, and the antenna unit 28 are located on a first circuit layer 121 of the substrate 12, and a vertical projection of the antenna unit 28 on a second circuit layer 122 is located in a clearance area 22. In this embodiment, in addition to conductive traces 181, 182, 183, 184, the grounding circuit 18 further includes a radio frequency grounding trace 185 located in the clearance area 22 of the second circuit layer 122 of the substrate 12 and close to a second side edge 124, and two ends of a radio frequency grounding trace 185 respectively extend to a third side edge 125 and a fourth side edge 126. The antenna unit 28 includes a second grounding connection portion 281, an antenna loop 282, and a signal source 283. The second grounding connection portion 281 is located on the first circuit layer 121 and is electrically connected to the radio frequency grounding trace 185 through a via hole 284. The antenna loop 282 is connected to the second grounding connection portion 281, extends along a metal line segment 142 to form a loop, and is connected to the signal source 283. A vertical projection of the antenna loop 282 on the second circuit layer 122 is located in the clearance area 22. The signal source 283 is electrically connected to the antenna loop 282 and the second grounding connection portion 281. A positive end of the signal source 283 is connected to the antenna loop 282, and a negative end of the signal source is connected to the second grounding connection portion 281. The antenna loop 282 is excited to generate a required antenna resonance frequency to transmit and receive a radio frequency signal.

Figure 14A:
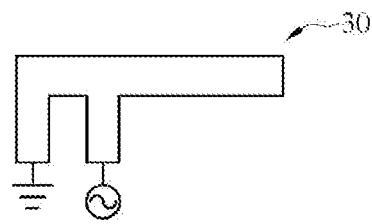
FIG. 14A to FIG. 14D are schematic diagrams of different embodiments of an antenna unit used in the disclosure.
Figure 14B:
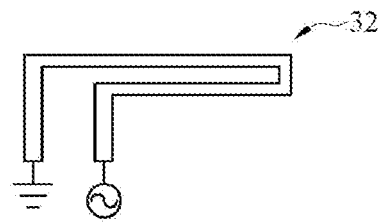
Figure 14C:
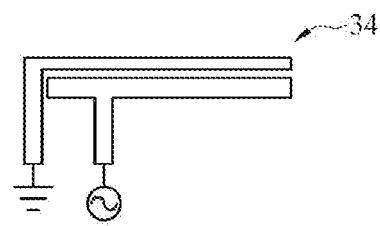
Figure 14D:
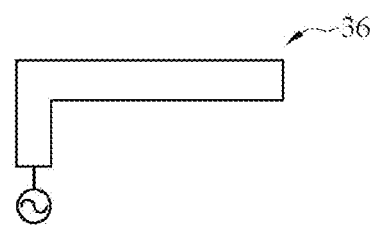

In an embodiment, referring to all of FIG. 14A to FIG. 14D, an antenna unit disposed in a circuit board includes various different aspects of the embodiments. As shown in FIG. 14A, an antenna unit 30 is a planar inverted-F antenna (PIFA). As shown in FIG. 14B, an antenna unit 32 is a loop antenna. As shown in FIG. 14C, an antenna unit 34 is a coupled antenna. As shown in FIG. 14D, an antenna unit 36 is a monopole antenna.

In an embodiment, the first antenna branch 202 and the second antenna branch 203 shown in FIG. 1, the first antenna branch 242, the antenna extension section 246, and the second antenna branch 243 shown in FIG. 5, the first antenna branch 261 and the second antenna branch 262 shown in FIG. 8, the second grounding connection portion 281 and the antenna loop 282 shown in FIG. 11, and the like, are made of conductive materials such as copper, silver, aluminum, iron, or alloys thereof.

Figure 15:
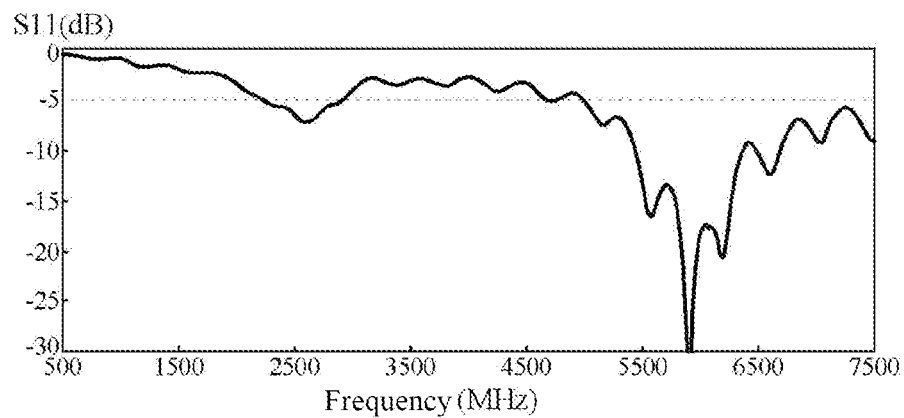
FIG. 15 is a schematic diagram of S-parameter simulation of an antenna unit used in the disclosure.

Referring to both FIG. 11 and FIG. 15, the antenna unit 28 in the circuit board 10 of FIG. 11 is used to simulate an S-parameter during transmission of radio frequency signal. Simulation results of the S-parameter in a low-frequency operating frequency band (2.4 GHz to 2.5 GHz) and a high-frequency operating frequency band (5 GHz to 7 GHz) are shown in FIG. 15. During operation in the low-frequency operating frequency band (2.4 GHz to 2.5 GHz), a return loss (S11) of an antenna resonance frequency band on the left side of the figure is almost always greater than 5 dB (S11<−5 dB). During operation in the high-frequency operating frequency band (5 GHz to 7 GHz), the return loss (S11) of the antenna resonance frequency band on the right side of the figure is also always greater than 5 dB (S11<−5 dB). Therefore, it can be known from the foregoing simulation results that the antenna unit 28 used in the disclosure has a good return loss in both the low-frequency operating frequency band and the high-frequency operating frequency band.

Figure 16:
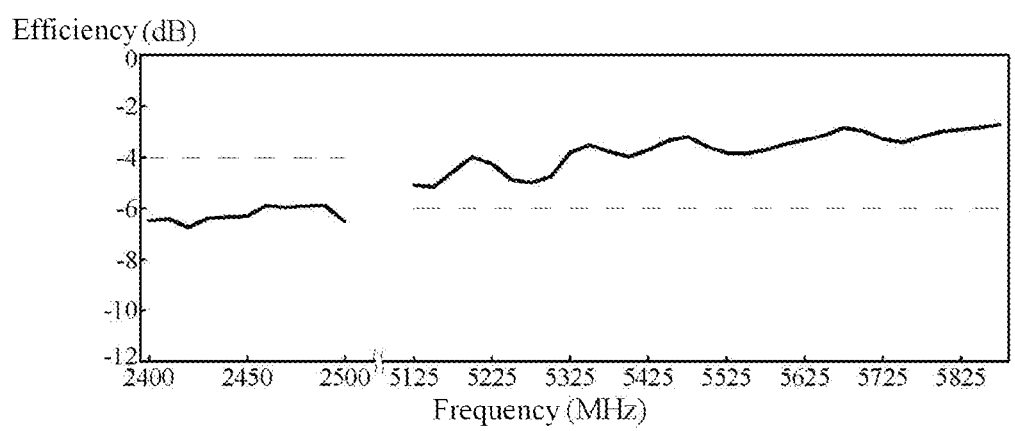
FIG. 16 is a schematic diagram of antenna efficiency simulation of an antenna unit used in the disclosure.

Referring to both FIG. 11 and FIG. 16, the antenna unit 28 in the circuit board 10 of FIG. 11 is configured to simulate antenna efficiency during transmission of a radio frequency signal. As shown in FIG. 16, the antenna efficiency in a low-frequency operating frequency band (2.4 GHz to 2.5 GHz) is about −6 dB, and the antenna efficiency in a high-frequency operating frequency band (5 GHz to 6 GHz) is always greater than −6 dB. Therefore, it can be known from the foregoing simulation results that the antenna unit 28 in the disclosure has quite good antenna efficiency.

To sum up, in the disclosure, a position for arranging conductive traces of a grounding circuit on a second circuit layer of a substrate is adjusted to provide a space for designing an antenna unit in a first circuit layer of the substrate, to integrate the antenna unit by effectively utilizing a limited space, so that a circuit board not only has a light emitting property, but also provides a wireless communication capability.

The embodiments described above are only used for explaining the technical ideas and characteristics of the disclosure to enable a person skilled in the art to understand and implement the content of the disclosure, and are not intended to limit the patent scope of the disclosure. That is, any equivalent change or modification made according to the spirit disclosed in the disclosure shall still fall within the patent scope of the disclosure.

What is claimed is:

1. A circuit board, comprising:
   a substrate, comprising a first circuit layer and a second circuit layer opposite to each other;
   a driver circuit, located on the first circuit layer;
   at least one light-emitting element, located on the first circuit layer and electrically connected to the driver circuit, so that the driver circuit controls the light-emitting element to emit light;
   a grounding circuit, located on the second circuit layer and electrically connected to the driver circuit, wherein the grounding circuit comprises a plurality of conductive traces, and the conductive traces are arranged toward one side in central to form a clearance area on the second circuit layer; and
   an antenna unit, located on the first circuit layer and corresponding to the clearance area to receive and transmit a radio frequency signal.

2. The circuit board according to claim 1, wherein the driver circuit comprises a plurality of conductive pads located on side edges of the first circuit layer and a metal line segment located on the first circuit layer and closest to the antenna unit, and the conductive pads are electrically connected to the grounding circuit.

3. The circuit board according to claim 2, wherein one of the plurality of conductive pads closest to the antenna unit serves as a first grounding connection portion of the antenna unit.

4. The circuit board according to claim 3, wherein the antenna unit further comprises:
   a first antenna branch, connected to the first grounding connection portion and the metal line segment;
   a second antenna branch, disposed spaced apart from the first antenna branch; and
   a signal source, electrically connected to the second antenna branch, to receive and transmit the radio frequency signal.

5. The circuit board according to claim 4, wherein the second antenna branch is a T-shaped antenna branch, comprising a horizontal line segment and a vertical line segment, the horizontal line segment extends along the first antenna branch, there is a gap between the horizontal line segment and the first antenna branch, and the vertical line segment is connected to the horizontal line segment and extends toward a direction away from the first antenna branch.

6. The circuit board according to claim 3, wherein the antenna unit further comprises:
   a first antenna branch, connected to the first grounding connection portion and the metal line segment;
   a second antenna branch, one end of the second antenna branch being connected to the first antenna branch; and a signal source, electrically connected to an other end of the second antenna branch and the first grounding connection portion, to receive and transmit the radio frequency signal.

7. The circuit board according to claim 6, wherein two electronic elements are disposed on the metal line segment, a part of the metal line segment located between the two electronic elements is open-circuited as an antenna extension branch, an other end of the first antenna branch is connected to the antenna extension branch, and the antenna extension branch extends outward and comprises an antenna extension section.

8. The circuit board according to claim 2, wherein the antenna unit further comprises:
- a first antenna branch, wherein a vertical projection of the first antenna branch on the second circuit layer is located in the clearance area;
- a second antenna branch, wherein the metal line segment forms an open circuit to serve as the second antenna branch; and
- a signal source, electrically connected to the first antenna branch, to receive and transmit the radio frequency signal.

9. The circuit board according to claim 8, wherein the metal line segment is electrically connected to the grounding circuit through a via hole, to form the open circuit.

10. The circuit board according to claim 1, wherein the grounding circuit further comprises a radio frequency grounding trace located in the clearance area of the second circuit layer, and the antenna unit further comprises:
- a second grounding connection portion, located at the first circuit layer and electrically connected to the radio frequency grounding trace;
- an antenna loop, wherein one end of the antenna loop is connected to the second grounding connection portion, and a vertical projection of the antenna loop on the second circuit layer is located in the clearance area; and
- a signal source, electrically connected to an other end of the antenna loop and the second grounding connection portion, to receive and transmit the radio frequency signal.

11. The circuit board according to claim 1, wherein the antenna unit is a monopole antenna, a planar inverted-F antenna (PIFA), a coupled antenna, or a loop antenna.

* * * * *